United States Patent
Wei

(10) Patent No.: US 6,190,990 B1
(45) Date of Patent: Feb. 20, 2001

(54) METHOD FOR MANUFACTURING THE STORAGE NODE OF A CAPACITOR ON A SEMICONDUCTOR WAFER

(75) Inventor: Houng-Chi Wei, I Lan Hsien (TW)

(73) Assignee: Mosel Vitelic Inc., Hsin-Chu (TW)

( * ) Notice: Under 35 U.S.C. 154(b), the term of this patent shall be extended for 0 days.

(21) Appl. No.: 09/231,707

(22) Filed: Jan. 13, 1999

(30) Foreign Application Priority Data

Sep. 2, 1998 (TW) ................................................ 87114584

(51) Int. Cl.$^7$ ....................................................... H01L 21/20
(52) U.S. Cl. ............................................ 438/396; 438/476
(58) Field of Search ........................................ 438/253, 254, 438/396, 397, 476

(56) References Cited

U.S. PATENT DOCUMENTS 5,595,929 * 1/1997 Tseng ...................................... 437/52

* cited by examiner

Primary Examiner—David Nelms
Assistant Examiner—Quoc Hoang
(74) Attorney, Agent, or Firm—Winston Hsu

(57) ABSTRACT

The present invention provides a new method which increases the surface area of the storage node of the capacitor, the method comprising: (1) Forming a photo resistor layer with a circular hole on the surface of the semiconductor wafer; (2) Using a wet isotropic etching method to form a bowl-like shallow concavity (pit) through the hole with a radius bigger than the hole; (3) Using a dry anisotropic etching process to etch a shallow pit through the hole in the central part of the bottom of the shallow pit down through the substrate of the semiconductor wafer; and (4) Eliminating the photo resistor layer, and then depositing a doped polysilicon layer over the shallow pit and the well resulting in a recess corresponding to the shallow pit and the well, wherein the deposition layer with a recess forms the storage node of a capacitor, the storage node having a recess with a larger surface area.

6 Claims, 3 Drawing Sheets

METHOD FOR MANUFACTURING THE STORAGE NODE OF A CAPACITOR ON A SEMICONDUCTOR WAFER

BACKGROUND OF THE INVENTION

1. Field of the Invention

The present invention relates to a method for manufacturing capacitor on a semiconductor wafer, and more particularly, to a method for manufacturing and increasing the storage node of a capacitor on a semiconductor wafer

2. Description of the Prior Art

Capacitor is an important component of a dynamic random access memory (DRAM) for storing data. If a capacitor of a DRAM can store more charges, then a sense amplifier will be less affected when retrieving data so that mistakes such as soft errors can be minimized. In the same time, frequency of recharging can also be reduced. Currently there are two approaches in increasing the storage capacity of a capacitor. The first method uses a dielectric material with a higher dielectric constant to deposit between a storage node and a field plate of a capacitor. In the second method, the surface area of a capacitor especially the surface area of the storage node and the field plate is enlarged so as to increase the total number of charges stored in the capacitor. Currently, most capacitor dielectric layers are made of the composite structure ONO (oxide/nitride/oxide). This material not only reduces the thickness of a single capacitor cell but also provides a better dielectric constant with a higher number of the charges stored in the capacitor per unit area.

Please refer to FIG. 1 to FIG. 3. FIG. 1 to FIG. 3 are the sketching diagrams of a method for manufacturing a stacked capacitor cell (STC) of a DRAM according to the prior art. Every element needed by the STC is prepared first. As illustrated in FIG. 1, a symmetrical pair of field oxide layers 14 is formed on the silicon substrate 12 of the surface of a semiconductor wafer 10, then a dielectric layer 16 is deposited over the pair of field oxide layers 14. The dielectric layer 16 further comprises a symmetrical pair of doped polysilicon bit lines 18. A neutral silicate glass (NSG) layer 20 is then deposited over the dielectric layer for protection and isolation. Finally, a photo resistor layer 22 is coated over the NSG layer 20, followed by etching a circular hole 23 in the center of the photo resistor layer 22.

Secondly, as illustrated in FIG. 2, a well 24 is etched perpendicularly down through the surface of the semiconductor wafer 10 by an anisotropic etching method, the well 24 being used as a capacitor contact window of the storage node, then the photo resistor layer 22 is eliminated followed by uniformly depositing an $SiO_2$ layer approximately 1000 Å thick over the surface of the side wall of the well 24 by using chemical vapor deposition (CVD) and etch back methods. This allows better isolation protection between the storage node and the bit line 18. Through use of the etch back technique, the thickness of the NSG layer 20 reduces from 2300 Å to about 1000 Å by this time.

Next, as illustrated in FIG. 3, a polysilicon layer is again deposited over the well 24 using the CVD method with ionic phosphorus being doped in-situ simultaneously. This method creates a doped polysilicon layer of uniform thickness over the well 24 and NSG layer 20. Then by using photolithography and etch methods the unwanted part of the doped polysilicon layer is removed to form a mushroom-shaped storage node 28. Aternatively, with the creation of the doped polysilicon layer, ionic dopants such as phosphorus may be introduced into the polysilicon layer by ion implantation.

Finally an ONO dielectric layer is deposited and formed on the single cell and field plate and a nitride layer about 5 nm thick is deposited directly on the surface of the storage node 28 by the CVD method, then an oxide layer about 2 nm thick is formed on the surface of the nitride layer by passing vapor at 920° C. through to reoxidize it. Thus by adding to the native oxide layer on the polysilicon surface of the storage node 28, an ONO composite dielectric layer 30 of the single cell is formed. CVD is then used to deposit a polysilicon layer again with the field plate 32 completing the production of a typical stacked capacitor cell (STC).

SUMMARY OF THE INVENTION

It is therefore a primary objective of the present invention to provide a new method for manufacturing a capacitor with a larger surface area in its storage node for storing more charges.

In a preferred embodiment, the present invention provides a method for manufacturing a storage node of a capacitor on the surface of a semiconductor wafer comprising:

(1) forming a photoresistor layer with a hole on the surface of a semiconductor wafer;

(2) etching a shallow pit under the hole using an isotropic etching technique, over which the shallow pit has a bigger radius than the hole;

(3) etching a vertical well under the hole of the photo resistor layer through the center of the shallow pit by using an anisotropic etching technique, over which the diameter of the vertical sell is approximately the same as the hole;

(4) eliminating the photo resistor layer; and (5) forming a deposition layer in the shallow pit and the well with a recess on the center portion of the upper surface of the deposition layer wherein the deposition layer defines the storage node of the capacitor.

It is an advantage of the present invention that provides a new method for manufacturing a storage node of a capacitor device, which can enlarge the surface of the storage node effectively, then enlarge the surface of the ONO dielectric layer and the field plate of the capacitor which is deposited later so as to store more charges.

This and other objectives and the advantages of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
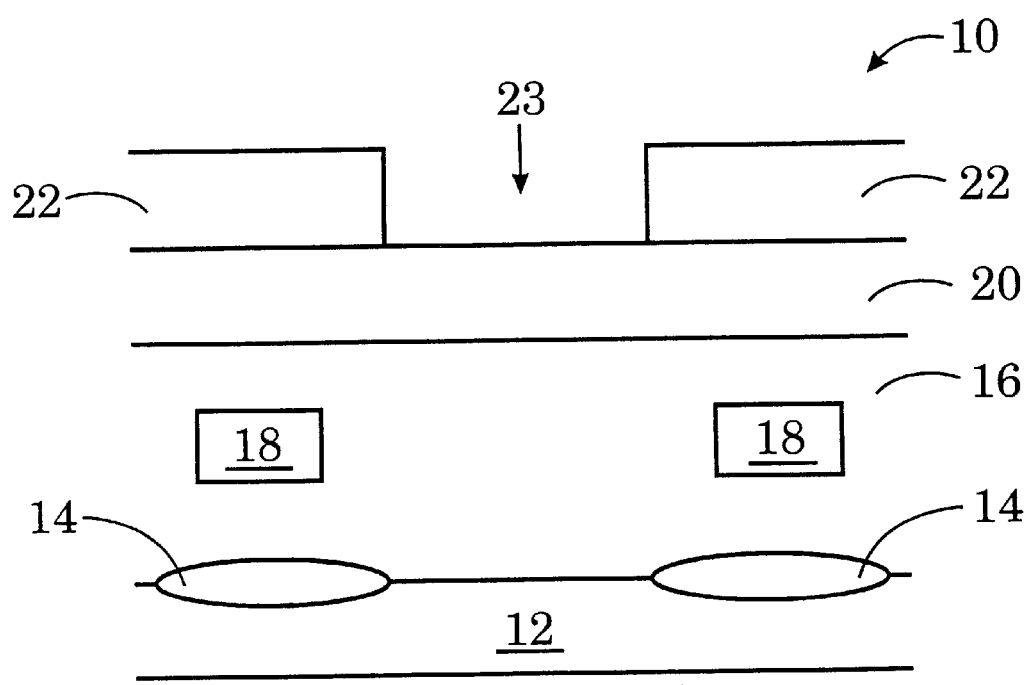
FIG. 1 to FIG. 3 are the sketching diagrams of a method for manufacturing a stacked capacitor cell (STC) of a dynamic random access memory (DRAM) according to the prior art.
Figure 2:
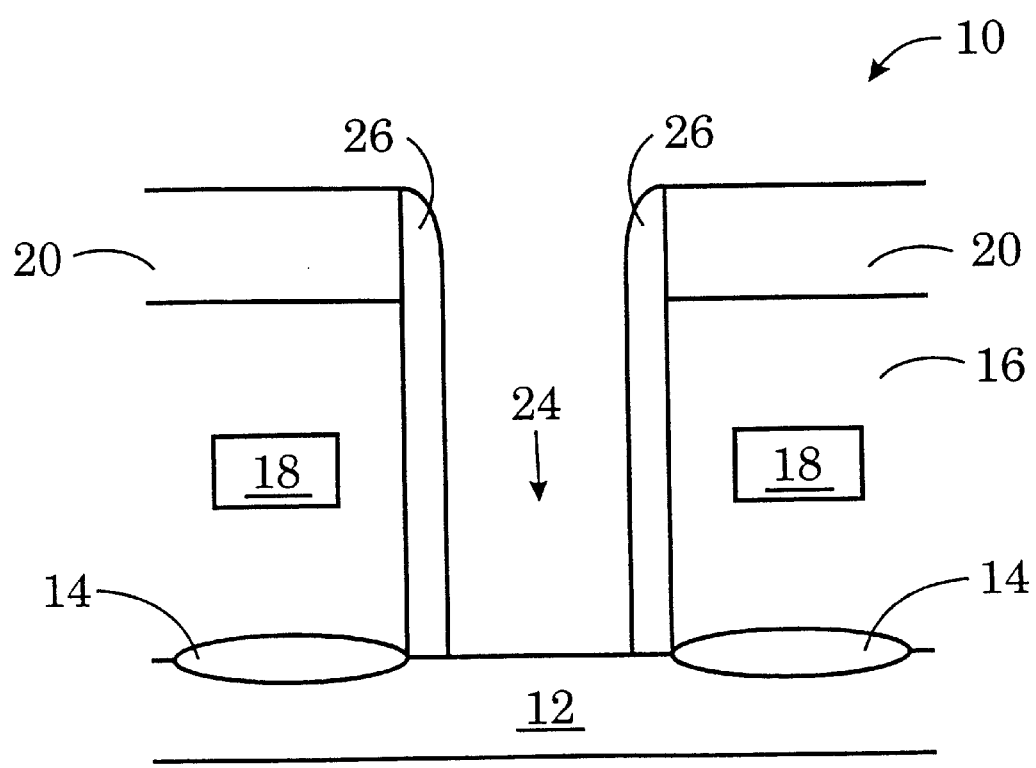
Figure 3:
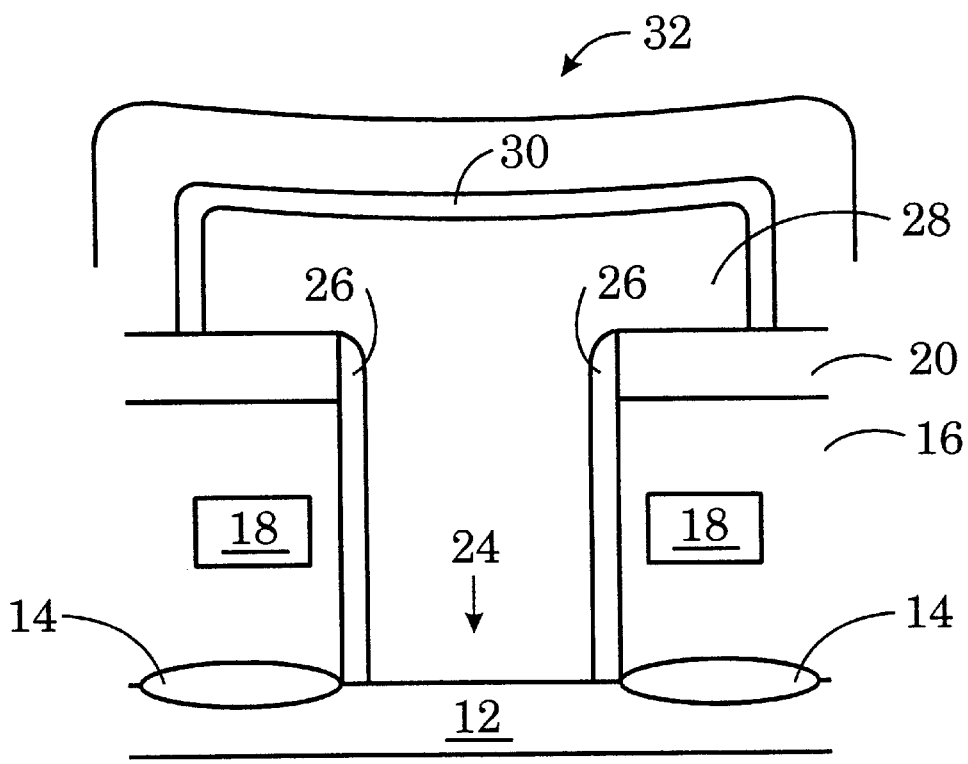
Figure 4:
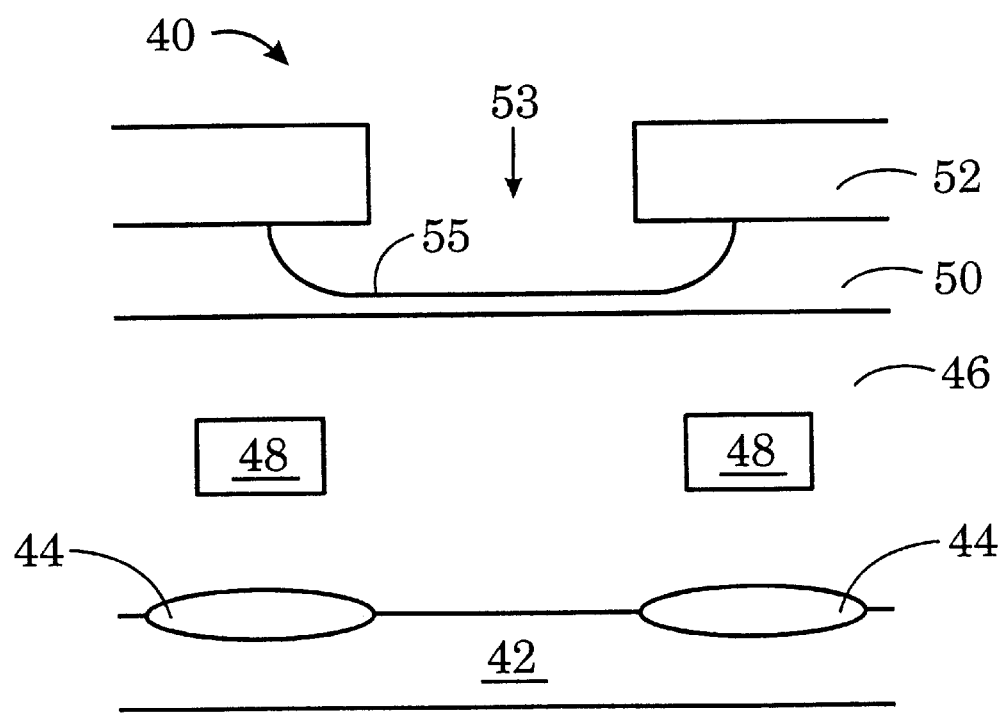
FIG. 4 to FIG. 6 are the sketching diagrams of the method for manufacturing a STC according to the present invention.
Figure 5:
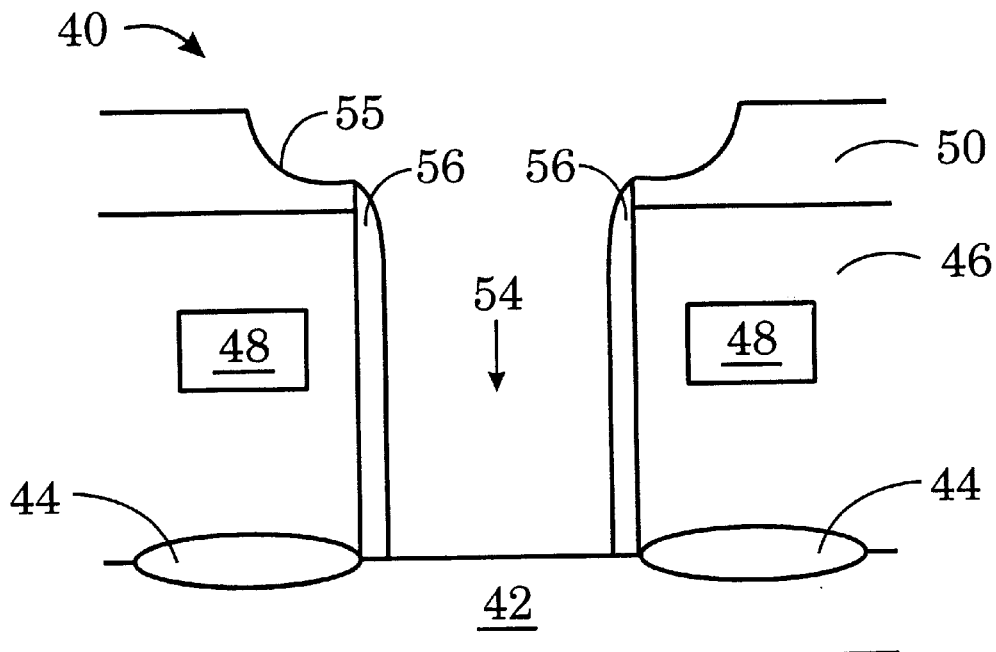
Figure 6:
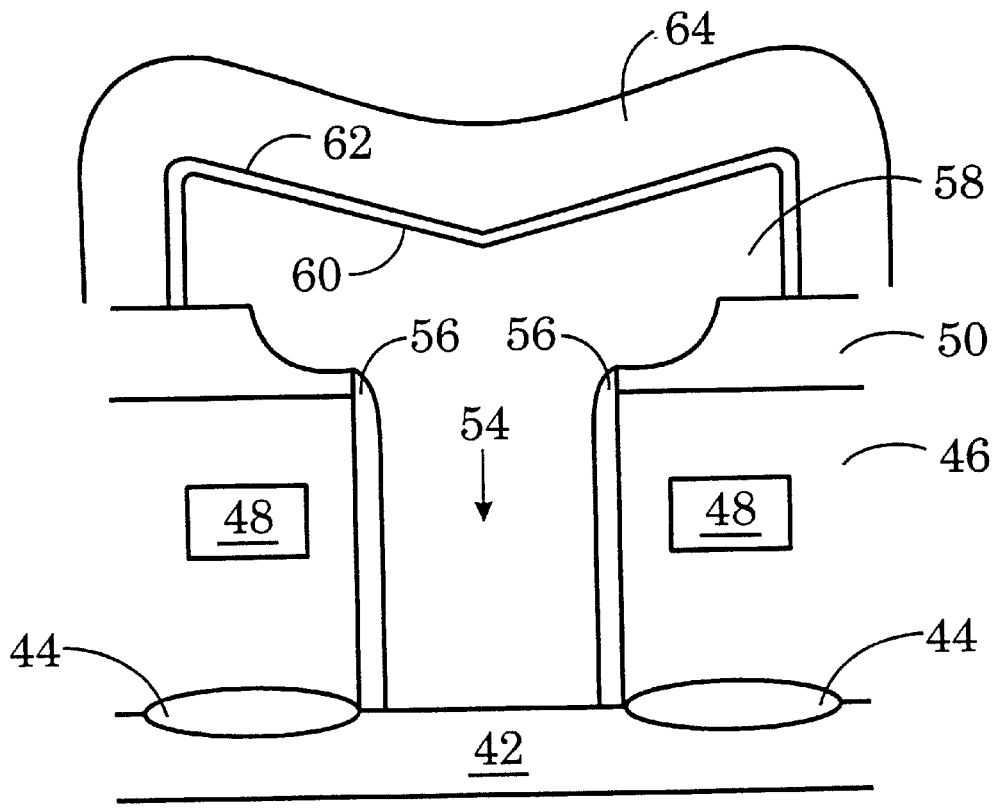

Please refer to FIG. 4 to FIG. 6. FIG. 4 to FIG. 6 are the sketching diagrams of the method for manufacturing an STC according to the present invention. As in FIG. 4 and the prior art processing method in FIG. 1 mentioned above, a symmetrical pair of field oxide layers 44 is formed on the silicon substrate 42 on the surface of the semiconductor wafer 40, an insulator layer 46 is formed on the field oxide layer 44, a symmetrical pair of polysilicon bit lines 48 is implanted within the insulator layer 46, an NSG layer 50 is deposited above the insulator layer 46, and a photo resistor layer 52 with a circular etching hole 53 in its center is coated over the NSG layer 50. Then, isotropic etching is performed on the NSG layer 50 with a 5% buffered HF solution using BOE wet etching to form a shallow pit 55 underneath the hole 53, the radius of the pit 55 being larger than that of the hole 53. Prior to removing the photo resistor layer, the pit 55 is a concavity.

Next, as illustrated in FIG. 5, anisotropic etching is used to etch a well 52 perpendicularly down into the semiconductor wafer 40 to form a concave capacitor contact window with the storage node, then the photo resistor layer 52 is removed and a silicon dioxide layer 56 about 1000 Å thick is uniformly deposited over the side wall of the well 54. Then, as illustrated in FIG. 6, by using CVD, lithography and etching techniques a uniformly doped ploysilicon layer is formed above the well 54 and NSG layer 50 as a storage node 58 of a STC. Finally an ONO composite structure dielectric layer 62 and a field plate 64 of the STC is formed in turn which completes the preparation of the STC device.

Where in this processing method according to the present invention, before etching the well 54, a shallow pit 55 is formed within the NSG layer 50 below the hole 53 of the photo resistor layer 52 by isotropic etching the surface of the semiconductor wafer 40, then a well 54 of the same radius with the hole 53 is formed by using anisotropic etching to etch perpendicularly down through the surface of the semiconductor wafer 40. The well 54 serves as a capacitor contact window of the storage node 56. FIG. 5 clearly shows that after removing the photo resistor layer 52, there is a step-like drop on the surface of the semiconductor wafer 40 with the surface of the NSG layer 50 is highest, the bottom of the shallow pit 55 being intermediate and the well 54 the deepest. As illustrated in FIG. 6, after depositing a polysilicon layer over the whole semiconductor wafer 40, a recess 60 is formed on the surface of the polysilicon layer. Due to the geography of the well 54, the shallow pit 55 and the NSG layer 50 the storage node 58 has a larger surface area. Furthermore, is can be seen that the processing method of the present invention can enhance the capacitance of the capacitor-over-bit-line (COB) STC by 6% over the average value per cell of the STC of the prior art.

Also, it can further enlarge the surface of the storage node 56 of an STC manufactured by a processing method according to the present invention in combination with other processes such as an HSG process or the deposition of rugged polysilicon.

Compared with the processing method of the prior art, the processing method of the present invention forms a shallow pit 55 with a radius bigger than the hole 53 within the NSG layer 50, then gives the deposited recess 60 a deeper step fall on its surface to enlarge the surface area of the storage node 58 and enhance the capacitance of the STC.

Those skilled in the art will readily observe that numerous modifications and alterations of the propeller may be made while retaining the teachings of the invention. Accordingly, the above disclosure should be construed as limited only by the metes and bounds of the appended claims.

What is claimed is:

1. A method for manufacturing a storage node of a capacitor on the surface of a semiconductor wafer, the method comprising:

(1) forming photoresist layer with a hole on the surface of semiconductor wafer;

(2) performing An isotropic etching process to from a shallow pit under the hole using a BOE wet etching technique, in which the shallow pit has a larger radius than the hole;

(3) etching a vertical well under the hole of the photoresist layer through the center of the shallow pit by using an anisotropic etching technique, in which the diameter of the vertical well is approximately the same as that of the hole;

(4) removing the photoresist layer;

(5) forming a deposition layer in the shallow pit and the well with a recess in a center portion of an upper surface of the deposition layer; the deposition layer defines the storage node of the (6) defining patter of the storage node and etching the deposition layer so to form the storage node;

(7) forming a dielectric layer that covers the storage node; and (8) forming a field plate that covers the dielectric layer.

2. The method of claim 1 wherein the deposition layer is made of polysilicon.

3. The method of claim 1 wherein the surface of the semiconductor wafer comprises a silicon layer and an overlying dielectric layer deposited above the silicon layer, and wherein the shallow pit is formed within the overlying dielectric layer, and the vertical well under the shallow pit is extended down to the silicon layer.

4. The method of claim 3 wherein the vertical well comprises a bottom plane and a vertical wall within the vertical well, and the method further comprises the following step:

forming an insulation layer on the surface of the vertical wall before forming the deposition layer so that the deposition layer is isolated from the silicon layer.

5. The method of claim 4 wherein the insulation layer is made of neutral silicate glass.

6. The method of claim 1 wherein a buffered hydrofluoric acid (5% HF) solution is used as an etching solution in the BOE wet etching method.

* * * * *